United States Patent [19]
Tani

[11] Patent Number: 5,814,887
[45] Date of Patent: Sep. 29, 1998

[54] SEMICONDUCTOR DEVICE AND PRODUCTION METHOD THEREOF

[75] Inventor: Tomofune Tani, Tokyo, Japan

[73] Assignee: Nippon Steel Corporation, Tokyo, Japan

[21] Appl. No.: 754,298

[22] Filed: Nov. 20, 1996

[30] Foreign Application Priority Data

Jan. 26, 1996 [JP] Japan .................................. 8-032666

[51] Int. Cl.$^6$ .................................................. H01L 23/48
[52] U.S. Cl. .......................... 257/751; 257/632; 257/773
[58] Field of Search .................... 257/659, 751, 257/790

[56] References Cited

U.S. PATENT DOCUMENTS

| | | | |
|---|---|---|---|
| 4,617,193 | 10/1986 | Wu ............................................. | 427/38 |
| 4,851,895 | 7/1989 | Green et al. ................................ | 357/67 |
| 5,376,817 | 12/1994 | Seyyedy et al. .......................... | 257/374 |
| 5,486,712 | 1/1996 | Arima ....................................... | 257/296 |
| 5,519,237 | 5/1996 | Itoh et al. ................................. | 257/306 |
| 5,606,202 | 2/1997 | Bronner et al. .......................... | 257/752 |
| 5,648,678 | 7/1997 | Begley et al. ............................ | 257/529 |

FOREIGN PATENT DOCUMENTS

| | | |
|---|---|---|
| A-63-128733 | 6/1988 | Japan . |
| A-2-125638 | 5/1990 | Japan . |
| A-5-121726 | 5/1993 | Japan . |
| A-7-122558 | 12/1995 | Japan . |

*Primary Examiner*—Olik Chaudhuri
*Assistant Examiner*—Douglas A. Wille
*Attorney, Agent, or Firm*—Pollock, Vande Sande & Priddy

[57] ABSTRACT

A semiconductor device having a conductor film for inhibiting intrusion of moisture, mobile ions, etc. into a semiconductor chip from its peripheral edge, formed in a contact trench formed in an inter-layer insulating film. The conductor film divides the inter-layer insulating film into a peripheral edge side and an internal side and is moreover connected electrically to a semiconductor substrate. Therefore, any moisture or mobile ions entering the inter-layer insulating film from the peripheral edge of the semiconductor chip are electrically caught or expelled and cannot enter the semiconductor chip. Further, because the conductor film is formed inside the contact trench, the conductor film does not peel from the semiconductor chip even when any influences of the moisture or the mobile ions caught exist. An internal conductor can be insulated from outside by providing a protective film for covering the upper and said surfaces of the semiconductor chip.

8 Claims, 6 Drawing Sheets

SEMICONDUCTOR DEVICE AND PRODUCTION METHOD THEREOF

BACKGROUND OF THE INVENTION

1. Field of the Invention

This invention relates to a semiconductor device and to a production method thereof. More particularly, the present invention relates to a semiconductor device which prevents moisture from entering a semiconductor chip from its peripheral edge, and catches or expels mobile ions which may otherwise enter the semiconductor chip.

2. Description of the Related Art

After devices such as MOS transistors are formed on a semiconductor wafer, the wafer is split into individual semiconductor chips in a scribe area disposed around a device formation area. Therefore, a section of an inter-layer insulating film having high water-permeability and hygroscopicity is exposed around the peripheral edge of the semiconductor chip. If moisture, mobile ions, etc., entering the inter-layer insulating film from the peripheral edge of the semiconductor chip further enter the inside of the semiconductor chip, corrosion of wiring, degradation of breakdown voltage of the insulating film, fluctuation of device characteristics, etc. are caused, and reliability of the semiconductor device drops.

To solve this problem, JP-A-63-128733 discloses a semiconductor device having a construction wherein a conductor film is formed to cover a region from a scribe area of a semiconductor wafer to the section of a semiconductor chip and is connected to a predetermined potential. In this semiconductor device, the conductor film forms an electric barrier to inhibit mobile ions such as $H^+$, $Na^+$, $Cl^-$, etc. from entering the semiconductor chip from the outside. In other words, when a positive bias is applied to this conductor film, positive ions such as $H^+$, $Na^+$, etc. are repulsed and cannot enter the inside of the semiconductor chip while negative ions such as $Cl^-$, etc. are entrapped into the conductor film. In either case, the mobile ions cannot enter the inside of the semiconductor chip.

According to the construction described above, however, the conductor film is likely to peel due to the influence of the moisture and the mobile ions. Since an impurity diffusion area formed in the semiconductor substrate so as to connect the conductor film to the predetermined potential appears in the section of the semiconductor chip, the potential inside the semiconductor chip is disturbed and the device's operation becomes unstable if this impurity diffusion area comes into contact with an external potential.

SUMMARY OF THE INVENTION

It is therefore the first object of the present invention to provide a semiconductor device having a structure which inhibits moisture from entering the inside of a semiconductor chip from its peripheral edge and which does not allow a conductor film for catching or expelling mobile ions, etc., that would otherwise enter, to easily peel.

It is the second object of the present invention to prevent the potential inside a semiconductor chip from being disturbed, and to prevent the operation from becoming unstable in the semiconductor device described above even when the semiconductor chip comes into contact with an external potential.

According to the first aspect of the present invention, a semiconductor device for accomplishing the first object described above comprises a semiconductor substrate having an impurity diffusion layer formed in a predetermined area; a pad electrode formed on the semiconductor substrate, and connected to the impurity diffusion layer; an inter-layer insulating film formed on the semiconductor substrate inclusive of the pad electrode, and having a contact trench for cutting off the inter-layer insulating film into a first area and a second area; a conductor film formed at least inside the contact trench, connected to the pad electrode, and encompassing the side surface of the first area of the inter-layer insulating film; and a protective film formed on the semiconductor substrate inclusive of the conductor film and the inter-layer insulating film.

It is also possible to employ the following construction. Namely, a second inter-layer insulating film is formed on the semiconductor substrate inclusive of the conductor film and the inter-layer insulating film. A second contact trench is formed in such a manner as to divide the second inter-layer insulating film into a third area and a fourth area, and a second conductor film is formed in the second contact trench and is connected to the conductor film described above to encompass the side surfaces of the first area of the inter-layer insulating film and the third area of the second inter-layer insulating film.

According to the first aspect of the present invention, the inter-layer insulating film is divided into the internal side of the semiconductor chip and its peripheral edge side by the conductor film formed in the contact trench (ditch-like contact hole) disposed in the inter-layer insulating film. This conductor film is electrically connected to the semiconductor substrate. Therefore, the same potential as that of the semiconductor substrate is applied to the conductor film, and moisture and mobile ions entering the inter-layer insulating film from the peripheral edge of the semiconductor chip are electrically caught or expelled. In consequence, these moisture and mobile ions can be prevented from moving towards the inside of the semiconductor chip. Since this conductor film is formed inside the contact trench, the conductor film does not easily peel even when any influence of moisture and the mobile ions exist.

A semiconductor device according to the second aspect for accomplishing the second object described above further comprises a plurality of second electrodes formed on a plurality of predetermined areas of the semiconductor substrate through a first insulating film; and a second insulating film formed on a plurality of the second electrodes; wherein a plurality of the second electrodes are isolated from the pad electrodes and the conductor films; one of a plurality of the second electrodes is formed below the second area of the first inter-layer insulating film; and the protective film encompasses the side surfaces of the second insulating film, the second area of the first inter-layer insulating film, and the fourth area of the second insulating film, respectively.

According to the second aspect of the present invention, the electrodes isolated from the pad electrode and the conductor films are formed below the second area of the inter-layer insulating film, and the protective film encompasses the section of the semiconductor chip, so that the impurity diffusion area of the semiconductor substrate is completely isolated from the outside. Therefore, even when the semiconductor chip comes into contact with an external potential, the potential inside the semiconductor chip is not disturbed, and the operation of the chip also does not become unstable.

DESCRIPTION OF THE PREFERRED EMBODIMENTS

Figure 1A:
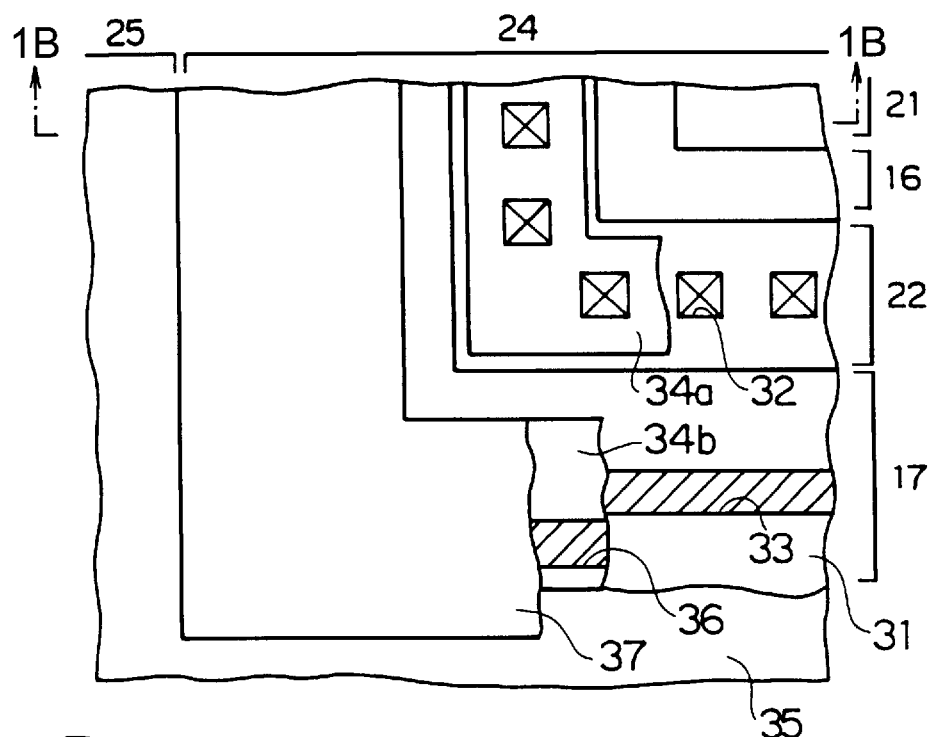
FIGS. 1A and 1B are a plan view and a sectional view, each showing a semiconductor device according to the first embodiment of the present invention.
Figure 1B:
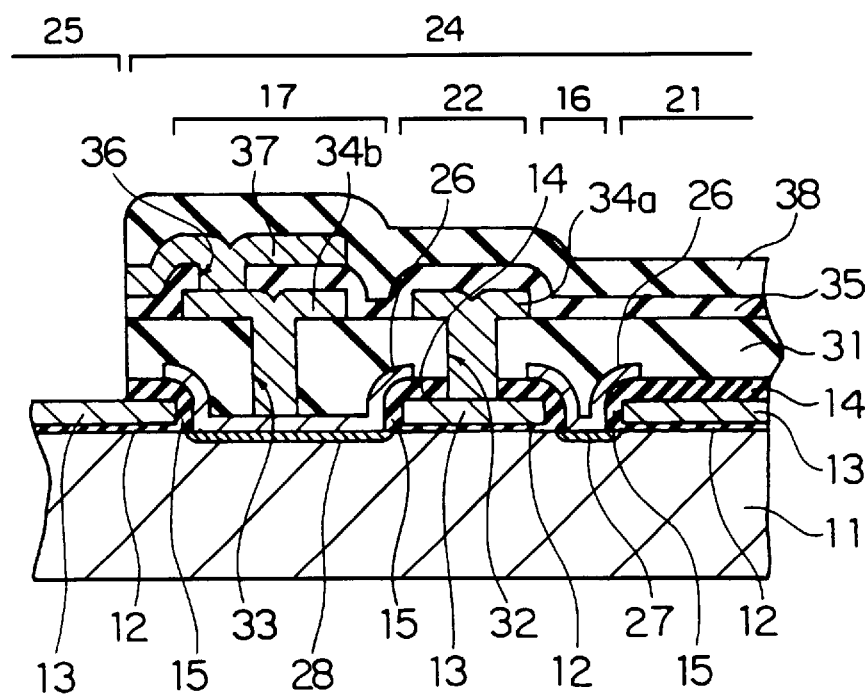

FIG. 1A is a plan view showing a portion near the corner of a chip area of a semiconductor device according to the first embodiment. The present invention is applied to a semiconductor device having a field shield device isolation structure. The drawing illustrates the inside of the semiconductor device by removing a passivation film (protective film) of the uppermost layer. FIG. 1B is a sectional view taken along line B—B of FIG. 1A.

A device activation area 17, a device isolation area 22, a device activation area 16, and a device isolation area 21 are formed in the chip area 24 as shown in this order from outside in FIGS. 1A and 1B. In each of the device isolation areas 21 and 22, a silicon dioxide film 12 as a field shield gate insulating film, a polycrystalline silicon film 13 as a field shield gate electrode, a cap oxide film 14 and a silicon dioxide film 15 as a sidewall oxide film are formed on a P-type silicon wafer, that is, a silicon substrate 11, in such a manner as to isolate devices by a field shield method.

The polycrystalline silicon film 13 of the device isolation area 22 is connected to a conductor film 34a of an aluminum alloy through a contact hole 32 bored in an inter-layer insulating film 31, and is controlled to a desired potential. The polycrystalline silicon film 13 of the device isolation area is connected to a wiring in an area not shown in the drawing, and is also controlled to have a desired potential.

A MOS transistor (not shown) is formed in the device activation area 16, and a P type impurity diffusion layer 27 as the source/drain of this MOS transistor is kept in contact with a pad electrode (lead-out electrode) 26 including a P type polycrystalline silicon film to which boron (B) is doped.

The device activation area 17 formed along the periphery of the chip area 24 to divide the device isolation area 22 from a scribe area 25. The pad electrode 26 and a P-type impurity diffusion layer 28 are formed in this device activation area 17. The pad electrode 26 is connected to a conductor film 34b of an aluminum alloy through a contact trench 33 opened in a ditch shape in the inter-layer insulating film 31 in such a manner as to encompass the chip area 24. In consequence, the conductor film 34b is electrically connected to the silicon substrate 11 through the pad electrode 26 and the impurity diffusion layer 28, and the inter-layer insulating film 31 is divided into the peripheral side of the chip and its internal side by the conductor film 34b.

An inter-layer insulating film 35 is formed on the inter-layer insulating film 31 and on the conductor films 34a and 34b, and a contact trench 36 is formed in this inter-layer insulating film 35 in such a manner as to encompass the chip area 24. The conductor film 34b is connected to the aluminum alloy conductor film 37 through this contact trench 36. As a result, the conductor film 37 is electrically connected to the silicon substrate 11 through the pad electrode 26 and the impurity diffusion layer 28, and the inter-layer insulating film 35 is divided by the conductor film 37 into the peripheral side of the chip and its internal side.

A passivation film 38 including a plasma CVD oxide film, etc. having high water-proofness is formed on the inter-layer insulating film 35 and the conductor film 37.

The scribe area 25 has a structure analogous to that of the device isolation areas 21 and 22, and has a portion including the silicon dioxide film 12 and the polycrystalline silicon film 13. However, the major portion of the cap oxide film 14 is removed so that a scribing operation can be smoothly carried out. The inter-layer insulating films 31 and 35 and the passivation film 38, too, are almost removed in the scribe area 25. For these reasons, the polycrystalline silicon film 13 in the scribe area 25 is exposed to the surface of the semiconductor chip.

In this embodiment, the passivation film 38 is removed from the side surfaces of the semiconductor chip. Therefore, the gap between the adjacent chip areas can be reduced, and this embodiment is suitable for forming a plurality of chip areas in a high density.

Next, a semiconductor device according to a modified embodiment of the first embodiment will be explained with reference to FIG. 1C. The difference in that the passivation film 38 is also on the side surface of the semiconductor chip. In this way, the conductor film 37 is prevented from coming into contact with the external potential. If the conductor inside the semiconductor chip comes into contact with the external potential, the potential inside the semiconductor chip is disturbed through capacitance coupling, and a circuit operation becomes unstabilized. If the impurity diffusion layer 28 extends to the scribe area 25 and is exposed on the side surface of the semiconductor chip, the impurity diffusion layer 28 may come into contact with the external potential. Therefore, an electrode structure including a silicon dioxide film 12 and a polycrystalline silicon film 13 is formed in the scribe area 25 in the same way as in the device isolation area 22 so as to insulate the impurity diffusion layer 28 from the outside.

Next, a production method of the semiconductor device according to the first embodiment will be explained with reference to FIGS. 2A to 2F.

Figure 2A:
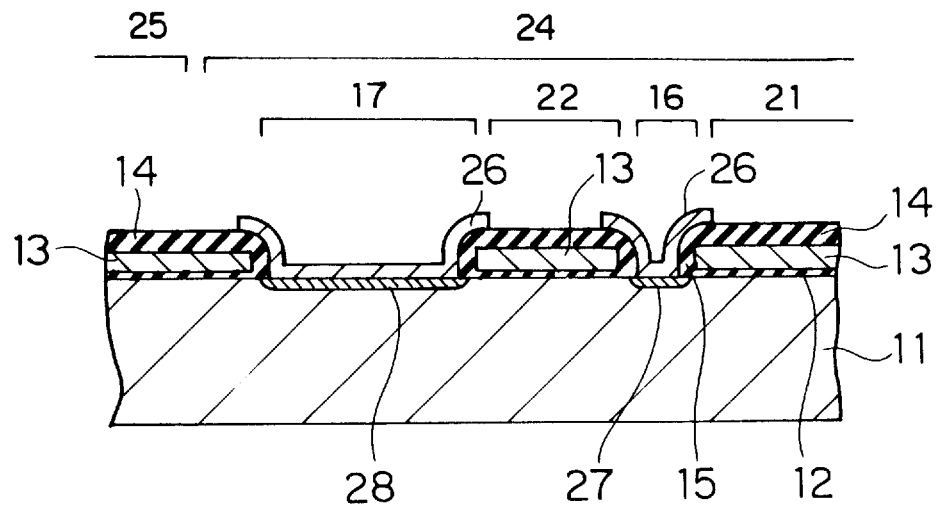
FIGS. 2A to 2F are sectional views, each showing stepwise the production method of the semiconductor device according to the first embodiment of the present invention.

To produce the semiconductor device of this embodiment, a silicon dioxide film 12 as a field shield gate insulating film is first formed by thermal oxidation on the surface of a P-type silicon wafer, that is, a silicon substrate 11, as shown in FIG. 2A, and a polycrystalline silicon film 13 and a cap oxide film 14 are successively deposited.

After the cap oxide film 14 and the polycrystalline silicon film 13 are patterned into the pattern of the field shield gate electrode, a silicon dioxide film 15 is deposited. The entire surface of this silicon dioxide film 15 is then etched back, and sidewall oxide film including this silicon dioxide film 15 is formed on the side surfaces of the polycrystalline silicon film 13 and the cap oxide film 14. In this way, device isolation areas 21 and 22 having a field shield device isolation structure and device activation areas 16 and 17 are formed in the chip area 24, and a portion having a similar structure to that of the device isolation areas 21 and 22 is formed in the scribe area 25.

Thereafter, a gate oxide film (not shown) and a gate electrode (not shown) of a MOS transistor are formed on the surface of the device activation area 16. Sidewall oxide films (not shown) are formed on the side surfaces of the gate electrode, and the gate oxide film of the portion other than below the gate electrode film and below the sidewall oxide films is removed simultaneously with the formation of the sidewall oxide film thereby exposing the silicon substrate 11.

Next, a polycrystalline silicon film 26, into which boron is doped, is deposited on the entire surface, and is brought into contact with the silicon substrate 11. The polycrystalline silicon film 26 is then etched by photolithography and etching into a pattern of a pad electrode covering the portions of the device activation area 16 other than the gate electrode and a pattern covering the entire portion of the device activation area 17.

Ions of a P type impurity are doped into the polycrystalline silicon film 26 of both the device activation areas 16 and 17. Heat-treatment is then carried out to diffuse in the solid phase the impurity contained in the polycrystalline silicon film 26 into the silicon substrate 11 and to form P-type impurity diffusion layers 27 and 28 in the device activation areas 16 and 17, respectively. The impurity diffusion layer 27 functions as the source/drain of the MOS transistor. Ions of an N-type impurity may be doped into the polycrystalline silicon film 26 in the device activation area 16 to form the impurity diffusion layer 27 of the N-type.

Figure 2B:
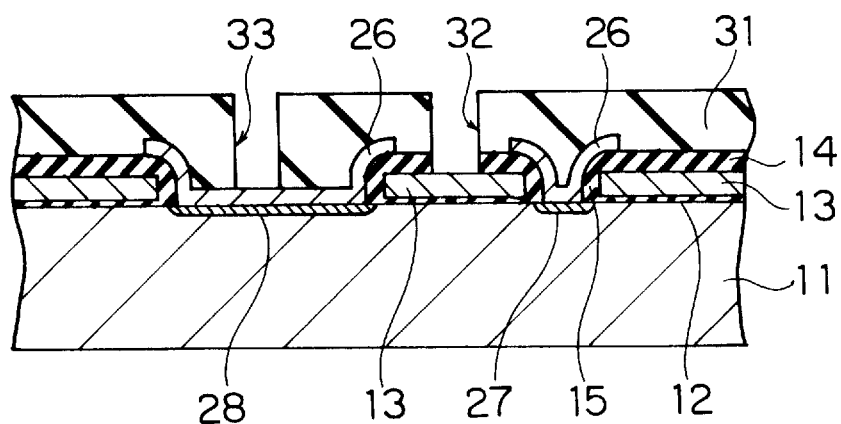

Next, an inter-layer insulating film 31 including a BPSG (boro-phospho silicate glass) film is deposited as shown in FIG. 2B, and this inter-layer insulating film 31 is flattened by reflow. A contact hole 32 and a contact trench 33 reaching the polycrystalline silicon film 13 of the device isolation area 22 and the polycrystalline silicon film 26 of the device activation area 17, respectively, are simultaneously formed by photolithography and etching. A plurality of contact holes 32 are formed in the device isolation area 22 in the spaced-apart relation with one another. The contact trench 33 is continuously formed in the ditch form along the periphery of the chip area 24. Therefore, the contact trench 33 divides the inter-layer insulating film 31 into the peripheral side and the internal side of the chip area 24. It is also possible to use a BSG (boro-silicate glass) film or a PSG (phospho-silicate glass) film in place of the BPSG film.

Figure 2C:
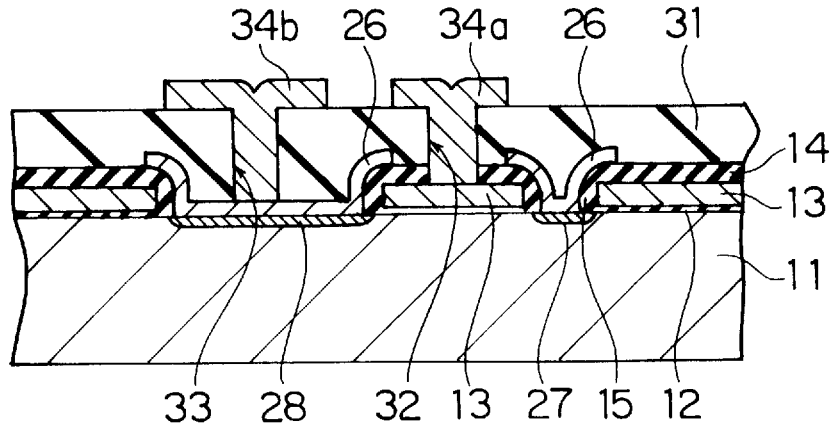

Next, as shown in FIG. 2C, an aluminum alloy conductor film formed by CVD or sputtering is etched by photolithography and etching into the patterns of memory cell wirings (not shown) in the device activation area 16. A conductor film 34a may be connected to the polycrystalline silicon film 13 by burying a contact hole 32 and a conductor film 34b to be connected to the polycrystalline silicon film 26 by burying a contact trench 33. A polycrystalline silicon film may be used for these conductor films 34a and 34b.

Figure 2D:
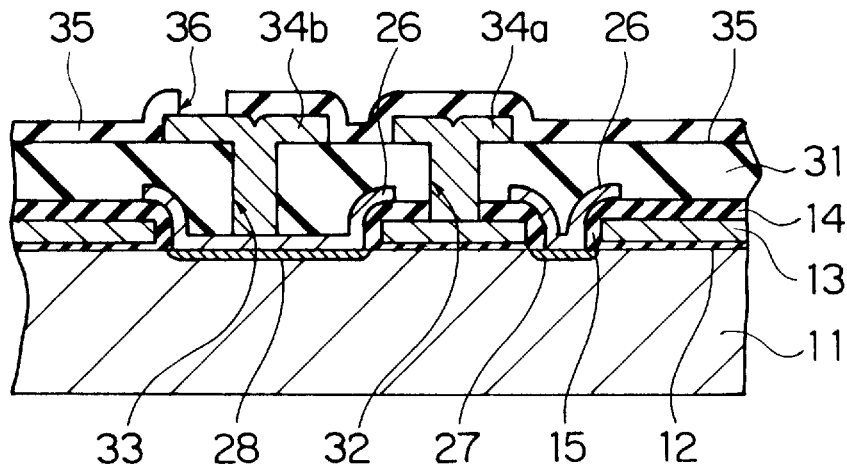

Next, an inter-layer insulating film 35 as a composite film of a plasma CVD (chemical vapor deposition) film or a plasma CVD oxide film with an SOG (spin-on-glass) film is deposited as shown in FIG. 2D, and a contact trench 36 reaching the conductor film 34b of the device activation area 17 is formed by photolithography and etching. This contact trench 36 is also shaped into a ditch form continuing along the periphery of the chip area 24 on the device activation area 17, and divides the inter-layer insulating film 35 into the peripheral side of the chip area 24 and its internal side.

Figure 2E:
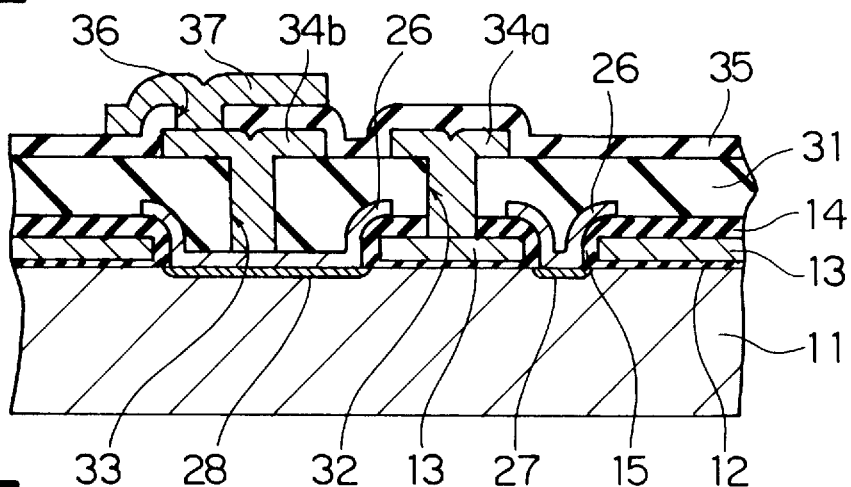
Figure 2F:
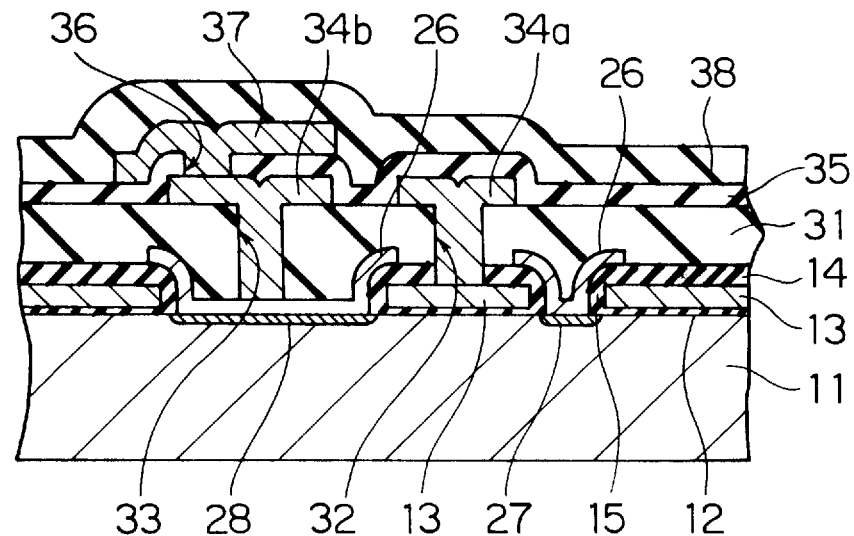

After an aluminum alloy conductor film 37 is deposited by CVD or sputtering as shown in FIG. 2E, the conductor film 37 is patterned by photolithography and etching into a wiring pattern of the memory cell (not shown) in the device activation area 16, etc. and a pattern of a wiring to be connected to the conductor film 34 by burying the contact trench 36. A polycrystalline silicon film, or the like, may be used for the conductor film 37.

Thereafter, a passivation film 38 as a plasma CVD oxide film having high water-proofness, etc. is deposited on the entire surface by CVD. The passivation film 38, the inter-layer insulating films 35 and 31 and the cap oxide film 14 in the scribe area 25 are then removed by photolithography and etching, and a semiconductor device according to the first embodiment is completed as shown in FIGS. 1A and 1B. The reason why the cap oxide film 14, etc. in the scribe area 25 is removed is to make the scribing operation easy.

In the semiconductor device according to this embodiment produced in the manner described above, the inter-layer insulating films 31 and 25 are divided into the peripheral side of the chip area 24 and its internal side by the conductor films 34b and 37. Moreover, the conductor films 34b and 37 are electrically connected to the P-type silicon substrate 11 through the P-type polycrystalline silicon film 26 and the P-type impurity diffusion layer 28. Therefore, the same potential as the potential of the silicon substrate 11 (e.g., ground potential $V_{ss}$) is applied to the conductor films 34b and 37, and the moisture and mobile ions penetrating into the inter-layer insulating films 31 and 35 from the periphery of the semiconductor chip are electrically captured by the conductor films 34b and 37, and are effectively prevented from entering the semiconductor chip. Because the conductor films 34b and 37 are formed simultaneously with V-the wiring of the transistors formed in the chip, the number of production steps for fabricating the semiconductor device of this embodiment does not increase. Further, because the conductor films 34b and 37 are buried into the contact trenches 33 and 36 formed in the inter-layer insulating films 31 and 35, respectively, they do not easily peel from the semiconductor chip even when any influence of the entering of moisture, or the caught mobile ions, exist.

Figure 1C:
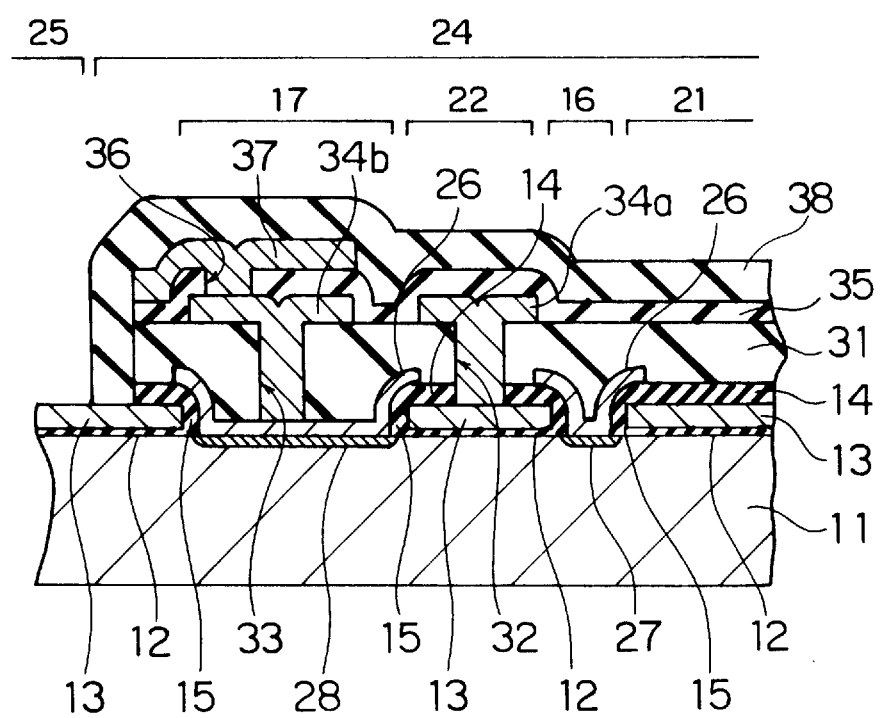
FIG. 1C is a sectional view showing a semiconductor device according to a modified embodiment of the first embodiment of the present invention.

The semiconductor device according to the modified embodiment of the first embodiment shown in FIG. 1C can be produced by the steps of removing, after the step shown in FIG. 2E, the inter-layer insulating films 35 and 31 and the cap insulating film 14 of the scribe area 25, forming the passivation film 38, covering the sidewall portions of the conductor film 37, the inter-layer insulating films 35 and 31 and the cap insulating film 14 with the passivation film 38, and then removing the passivation film 38 of the scribe area 25. This structure prevents the conductor film 37 from coming into contact with the external potential, and can doubly prevent the intrusion of impurities such as the moisture and the mobile ions from the peripheral edge of the chip area 24.

The second embodiment of the present invention will now be explained with reference to FIGS. 3A and 3B.

Figure 3A:
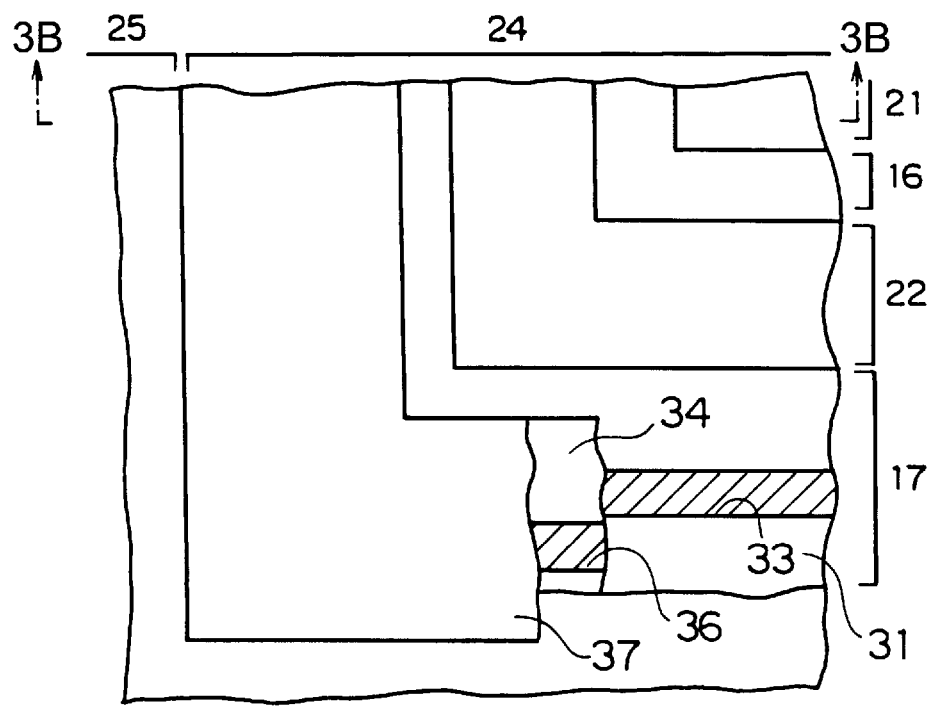
FIGS. 3A and 3B are a plan view and a sectional view, each showing a semiconductor device according to the second embodiment of the present invention.
Figure 3B:
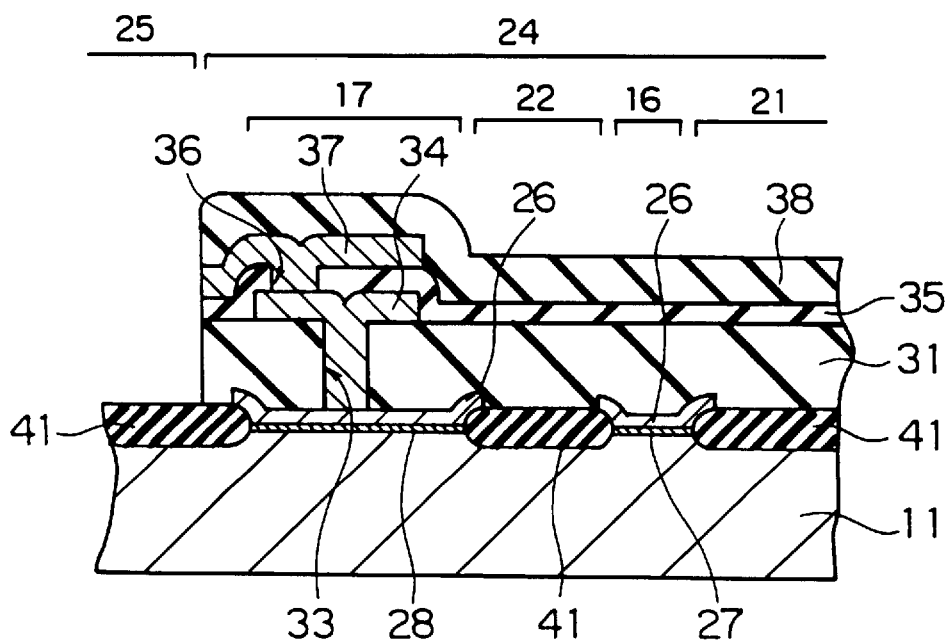
Figure 3C:
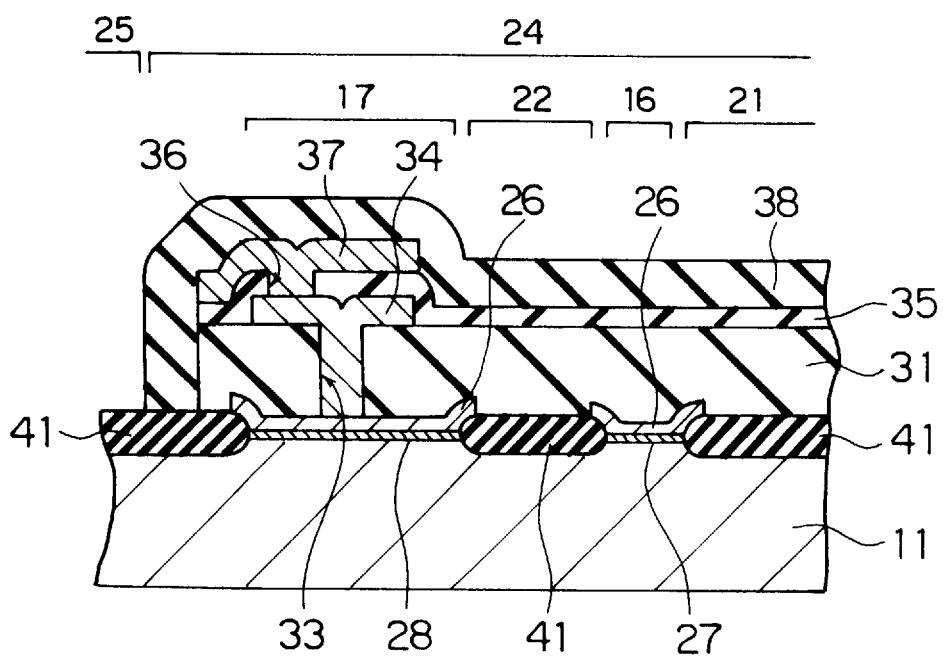
FIG. 3C is a sectional view showing a semiconductor device according to a modified embodiment of the second embodiment of the present invention.

FIG. 3A is a plan view showing a portion near a corner of a chip area of a semiconductor device according to the second embodiment wherein the present invention is applied to a semiconductor device isolated by a LOCOS (local oxidation of silicon) method. This drawing shows the inside by removing a passivation film of the uppermost layer. FIG. 3B is a sectional view taken along line B—B of FIG. 3A. The relation between the chip area 24 and the scribe area 25 on the semiconductor wafer is the same as the relation shown in FIG. 1A.

The semiconductor device according to this second embodiment has substantially the same construction as that of the first embodiment shown in FIGS. 1A to 2F with the exception that it employs an oxide film device isolation structure comprising a silicon dioxide film 41 formed by the LOCOS method in place of the field shield device isolation structure.

Next, a semiconductor device according to a modified embodiment of the second embodiment will be explained with reference to FIG. 2C. The difference between this modified embodiment and the second embodiment resides in that the passivation film 38 is formed on the side surfaces of the semiconductor chip, too, and the conductor film 37 is prevented from coming into contact with the external potential. If the impurity diffusion layer 28 extending to the scribe area 25 is exposed on the side surface of the semiconductor chip, there is the possibility of contact with the external potential. Therefore, the silicon dioxide film 41 is formed in the scribe area 25, too, by the LOCOS method, in the same way as in the device isolation area 22, to isolate the impurity diffusion layer 28 from the outside.

Though the polycrystalline silicon film 26 and the impurity diffusion layer 28 are of the P-type in the foregoing first and second embodiments, similar effects can be likewise obtained when they are of the N-type because the conductor films 34b and 37 are connected electrically to the substrate 11 through the P-N junction.

According to the present invention described above, the moisture and the mobile ions entering the inter-layer insulating films from the peripheral edge of the semiconductor chip are electrically captured or expelled by the wiring layers burying the contact trenches, and are effectively prevented from moving into the semiconductor chip. Accordingly, even if any influence of the entering moisture and the captured mobile ions exist, the wiring layer does not easily peel from the semiconductor chip, and a semiconductor chip having high reliability can be obtained.

Furthermore, as the protective film is formed on the side surfaces of the semiconductor chip, too, the wiring layer and the impurity diffusion layer can be protected from the contact with the external potential, and intrusion of impurities such as the moisture and the mobile ions from the peripheral edge of the semiconductor chip can be doubly inhibited.

I claim:

1. A semiconductor device comprising:
    a semiconductor substrate having an impurity diffusion layer formed in a predetermined area;
    a pad electrode formed on said semiconductor substrate and connected to said impurity diffusion layer;
    an inter-layer insulating film formed over said semiconductor substrate inclusive of said pad electrode, and having a contact trench which forms a trench loop in said inter-layer insulating film thereby dividing said inter-layer insulating film into a first area which is encompassed by said trench loop and a second area which is not encompassed by said trench loop;
    a conductor film formed at least inside said contact trench along said trench loop and connected to said pad electrode thereby encompassing a side surface of the first area of said inter-layer insulating film; and
    a protective film formed over said semiconductor substrate inclusive of said conductor film and said inter-layer insulating film.

2. A semiconductor device according to claim 1, wherein said protective film is formed in at least an area encompassed by said conductor film.

3. A semiconductor device according to claim 1, further comprising:
    a plurality of second electrodes formed over predetermined areas of said semiconductor substrate through a first insulating film formed on said predetermined areas of said semiconductor substrate; and
    a second insulating film formed on at least said plurality of second electrodes, wherein:
    said plurality of second electrodes are insulated from said pad electrode and from said conductor film;
    at least one of said plurality of second electrodes is formed under the second area of said interlayer insulating film; and
    said protective film encompasses at least one side surface of said second insulating film and at least one side surface of the second area of said inter-layer insulating film.

4. A semiconductor device according to claim 1, further comprising:
    a plurality of device isolation films formed on a plurality of predetermined areas of said semiconductor substrate, respectively, wherein:
    at least one of said plurality of said device isolation films is formed under the second area of said inter-layer insulating film; and
    said protective film encompasses at least one side surface of the second area of said inter-layer insulating film.

5. A semiconductor device comprising:
    a semiconductor substrate having an impurity diffusion layer formed in a predetermined area;
    a pad electrode formed on said semiconductor substrate and connected to said impurity diffusion layer;
    a first inter-layer insulating film formed over said semiconductor substrate inclusive of said pad electrode, and having a first contact trench which forms a first trench loop in said first inter-layer insulating film thereby dividing said first inter-layer insulating film into a first area which is encompassed by said first trench loop and a second area which is not encompassed by said first trench loop;
    a first conductor film formed at least inside said first contact trench along said first trench loop and connected to said pad electrode;
    a second inter-layer insulating film formed over said semiconductor substrate inclusive of said first conductor film and said first inter-layer insulating film, and having a second contact trench which forms a second trench loop in said second interlayer insulating film thereby dividing said second inter-layer insulating film into a third area which is encompassed by said second trench loop and a fourth area which is not encompassed by said second trench loop;
    a second conductor film formed at least inside said second contact trench along said second trench loop, said first and second conductor films being mutually connected thereby encompassing respective side surfaces of the first area of said first inter-layer insulating film and the third area of said second inter-layer insulating film; and
    a protective film formed over said semiconductor substrate inclusive of said second conductor film and said second inter-layer insulating film.

6. A semiconductor device according to claim 5, wherein said protective film is formed in at least an area encompassed by said second conductor film.

7. A semiconductor device according to claim 5, further comprising:
    a plurality of second electrodes formed over predetermined areas of said semiconductor substrate through a first insulating film formed on said predetermined areas of said semiconductor substrate; and
    a second insulating film formed on said plurality of second electrodes, wherein:

said plurality of second electrodes are isolated from said pad electrodes and from said first and second conductor films;

at least one of said plurality of second electrodes is formed under the second area of said first inter-layer insulating film; and said protective film encompasses at least one side surface of said second insulating film, at least one side surface of the second area of said first inter-layer insulating film and at least one side surface of the fourth area of said second inter-layer insulating film.

8. A semiconductor device according to claim 5, further comprising:

a plurality of device isolation films formed on a plurality of predetermined areas of said semiconductor substrate, respectively, wherein:

one of said plurality of device isolation films is formed under the second area of said first inter-layer insulating film; and said protective film encompasses at least one side surface of the second area of said first inter-layer insulating film and at least one side surface of the fourth area of said second inter-layer insulating film.

* * * * *